(12) United States Patent
Miyahara et al.

(10) Patent No.: US 10,644,078 B2
(45) Date of Patent: May 5, 2020

(54) ORGANIC ELECTROLUMINESCENCE DISPLAY DEVICE HAVING A POLARIZER COMPRISED OF POLARIZATION REGIONS

(71) Applicant: FUJIFILM Corporation, Tokyo (JP)

(72) Inventors: Takashi Miyahara, Minami-ashigara (JP); Yuya Hamaguchi, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 74 days.

(21) Appl. No.: 15/896,443

(22) Filed: Feb. 14, 2018

(65) Prior Publication Data
US 2018/0175122 A1 Jun. 21, 2018

Related U.S. Application Data

(63) Continuation of application No. PCT/JP2016/075627, filed on Sep. 1, 2016.

(30) Foreign Application Priority Data

Sep. 3, 2015 (JP) .................................. 2015-173912

(51) Int. Cl.
*H01L 27/32* (2006.01)
*G02B 5/30* (2006.01)
(Continued)

(52) U.S. Cl.
CPC ............ *H01L 27/3218* (2013.01); *G02B 5/30* (2013.01); *G09F 9/30* (2013.01); *H01L 27/3244* (2013.01);
(Continued)

(58) Field of Classification Search
CPC ............. H01L 27/3218; H01L 27/3244; H01L 51/5281; H01L 51/5293; G02B 5/30; G09F 9/30
See application file for complete search history.

(56) References Cited

U.S. PATENT DOCUMENTS 8,390,187 B2 * 3/2013 Jung .................... G02B 5/3025
                                                         313/498
8,982,461 B2 * 3/2015 Wu .......................... G02B 5/30
                                                         359/483.01
(Continued)

FOREIGN PATENT DOCUMENTS

JP         9-127885 A     5/1997
JP        10-260387 A     9/1998
(Continued)

OTHER PUBLICATIONS

International Preliminary Report on Patentability and Written Opinion of the International Searching Authority (forms PCT/IB/373, PCT/ISA/237 and PCT/IB/326), dated Mar. 6, 2018, for corresponding International Application No. PCT/JP2016/075627, with an English translation of the Written Opinion.
(Continued)

*Primary Examiner* — Allen L Parker
*Assistant Examiner* — Charles N Ausar-El
(74) *Attorney, Agent, or Firm* — Birch, Stewart, Kolasch & Birch, LLP

(57) ABSTRACT

An object of the present invention is to provide an organic EL display device having high luminance while maintaining an excellent effect of suppressing external light reflection. The organic electroluminescence display device of the present invention includes a polarizer, an optically anisotropic layer, and a light emitting layer in this order, in which the light emitting layer includes at least a plurality of first light emitting layers that emit a first color light, a plurality of second light emitting layers that emit a second color light, and a plurality of third light emitting layers that emit a third color light, on the same plane, and the polarizer has at least two regions selected from the group consisting of a first polarization region in which a transmittance of the first color light emitted from the first light emitting layer is greater than (Continued)

or equal to 60% and an average visible light transmittance is 30% to 55%, a second polarization region in which a transmittance of the second color light emitted from the second light emitting layer is greater than or equal to 60% and an average visible light transmittance is 30% to 55%, and a third polarization region in which a transmittance of the third color light emitted from the third light emitting layer is greater than or equal to 60% and an average visible light transmittance is 30% to 55%.

16 Claims, 1 Drawing Sheet

(51) Int. Cl.
  G09F 9/30 (2006.01)
  H01L 51/52 (2006.01)
(52) U.S. Cl.
  CPC ...... H01L 51/5281 (2013.01); H01L 51/5293 (2013.01); *H01L 27/3211* (2013.01); *H01L 51/5284* (2013.01)

(56) References Cited

U.S. PATENT DOCUMENTS

| | | | |
|---|---|---|---|
| 9,158,050 B2 * | 10/2015 | Hong | G02B 5/3033 |
| 2002/0024625 A1 | 2/2002 | Anderson et al. | |
| 2002/0093284 A1 * | 7/2002 | Adachi | H01L 27/3211 |
| | | | 313/506 |
| 2002/0159004 A1 * | 10/2002 | Jung | G02B 5/3016 |
| | | | 349/87 |
| 2007/0182885 A1 * | 8/2007 | Egi | G02F 1/133528 |
| | | | 349/96 |
| 2008/0259232 A1 * | 10/2008 | Kim | G02F 1/133528 |
| | | | 349/15 |
| 2010/0072880 A1 | 3/2010 | Adachi et al. | |
| 2012/0099054 A1 * | 4/2012 | Takeuchi | G02B 5/201 |
| | | | 349/98 |
| 2014/0016081 A1 * | 1/2014 | Kakubari | G02B 5/3016 |
| | | | 349/201 |
| 2014/0198272 A1 * | 7/2014 | Hamaguchi | G02B 5/3083 |
| | | | 349/15 |
| 2014/0375927 A1 * | 12/2014 | Ishiguro | G02B 5/3083 |
| | | | 349/61 |
| 2014/0375935 A1 * | 12/2014 | Yamada | G02B 5/3025 |
| | | | 349/103 |
| 2015/0212246 A1 * | 7/2015 | Yoshida | G02B 5/3016 |
| | | | 349/194 |
| 2015/0243933 A1 * | 8/2015 | Lee | H01L 51/5281 |
| | | | 257/40 |
| 2015/0380689 A1 * | 12/2015 | Choi | G02B 5/3033 |
| | | | 257/40 |
| 2016/0200255 A1 * | 7/2016 | Takada | B60R 1/12 |
| | | | 359/488.01 |
| 2016/0238881 A1 * | 8/2016 | Chong | G02B 6/0011 |
| 2016/0329527 A1 * | 11/2016 | Yang | H01L 51/5281 |
| 2017/0068031 A1 | 3/2017 | Yoshizawa et al. | |
| 2018/0052359 A1 * | 2/2018 | Umemoto | G02F 1/1333 |
| 2018/0172887 A1 * | 6/2018 | Ko | G02F 1/133536 |

FOREIGN PATENT DOCUMENTS

| | | |
|---|---|---|
| JP | 2005-63841 A | 3/2005 |
| JP | 2011-81334 A | 4/2011 |
| JP | 2013-109090 A | 6/2013 |
| JP | 2014-6353 A | 1/2014 |
| JP | 2015-227947 A | 12/2015 |
| JP | 2016-170369 A | 9/2016 |
| WO | WO-2013100115 A1 * | 7/2013 ........... G02B 5/3083 |
| WO | WO 2013/137464 A1 | 9/2013 |

OTHER PUBLICATIONS

International Search Report (form PCT/ISA/210), dated Nov. 29, 2016, for corresponding International Application No. PCT/JP2016/075627, with an English translation.

* cited by examiner

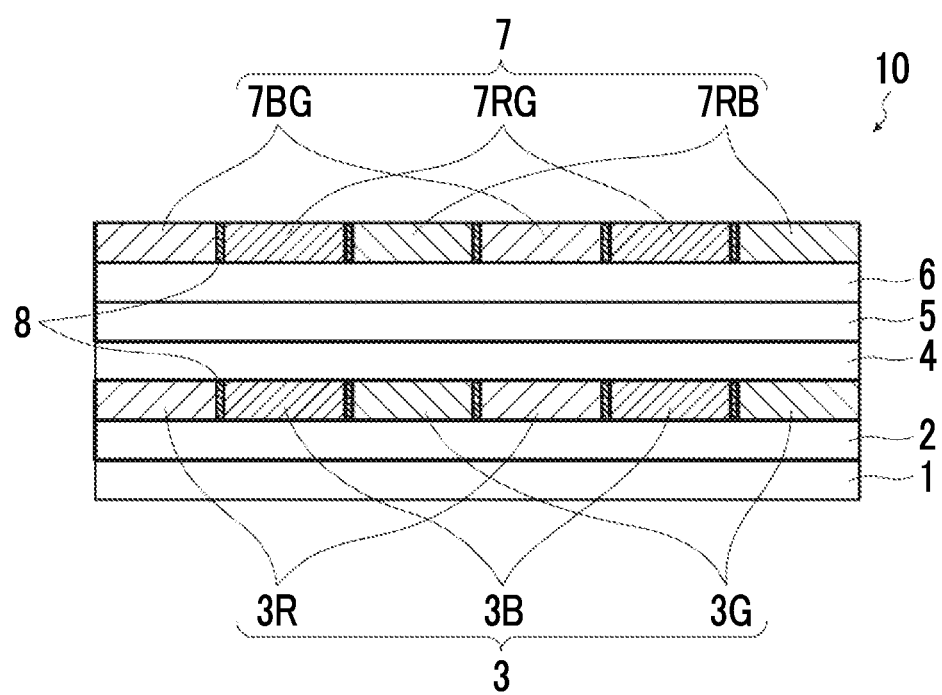

ORGANIC ELECTROLUMINESCENCE DISPLAY DEVICE HAVING A POLARIZER COMPRISED OF POLARIZATION REGIONS

CROSS-REFERENCE TO RELATED APPLICATIONS

This application is a Continuation of PCT International Application No. PCT/JP2016/075627 filed on Sep. 1, 2016, which claims priority under 35 U.S.C. § 119(a) to Japanese Patent Application No. 2015-173912 filed on Sep. 3, 2015. The above application is hereby expressly incorporated by reference, in its entirety, into the present application.

BACKGROUND OF THE INVENTION

1. Field of the Invention

The present invention relates to an organic electroluminescence (EL) display device.

2. Description of the Related Art

The organic EL display device is a self-luminous thin type display device, and has advantages of display performance such as high visibility and less viewing angle dependency compared to a liquid crystal display device.

In addition, the organic EL display device has a possibility of realizing a display device having a shape, which has not been realized, by using a flexible substrate, in addition to advantages that the display can be reduced in weight and can have a thin layer.

On the other hand, in the organic EL display device, layers having different refractive indexes are laminated on an electrode using a transparent conductive material such as indium tin oxide (ITO), which has a high refractive index, or a metallic material having a high reflectance is used. Therefore, it is known that external light is reflected at these interfaces, causing problems of contrast reduction or reflected glare due to internal reflection.

In order to suppress such problems due to such external light reflection, it is known that a circular polarization plate is used on a light emitting surface side (for example, refer to JP1997-127885A (JP-H09-127885A) and WO2013/137464A).

SUMMARY OF THE INVENTION

Since the organic EL display devices disclosed in JP1997-127885A (JP-H09-127885A), WO2013/137464A, and the like use a circular polarization plate, the effect of suppressing external light reflection is high, but it is necessary to use a polarizer (linear polarizer) in the circular polarization plate. Therefore, there are problems in that the visible light transmittance becomes 40% to 50%, which inevitably reduces the luminance of the organic EL display devices.

That is, in the organic EL display device in the related art, the suppression of external light reflection and the improvement in luminance are in a trade-off relationship.

An object of the present invention is to provide an organic EL display device having high luminance while maintaining an excellent effect of suppressing external light reflection.

The present inventors have conducted extensive studies in order to solve the above-described problems. As a result, they have found that an organic EL display device including a light emitting layer that emits light of each color such as red (R), blue (B), and green (G), an optically anisotropic layer, and a polarizer having two or more predetermined regions of which the transmittance is changed so as to correspond to an emission fraction of the light emitting layer exhibits high luminance while maintaining the excellent effect of suppressing external light reflection, and have completed the present invention.

That is, they have found that it is possible to achieve the above-described object using the following configuration.

[1] An organic electroluminescence display device comprising: a polarizer; an optically anisotropic layer; and a light emitting layer in this order, in which the light emitting layer includes at least a plurality of first light emitting layers that emit a first color light, a plurality of second light emitting layers that emit a second color light, and a plurality of third light emitting layers that emit a third color light, on the same plane, and the polarizer has at least two regions selected from the group consisting of a first polarization region in which a transmittance of the first color light emitted from the first light emitting layer is greater than or equal to 60% and an average visible light transmittance is 30% to 55%, a second polarization region in which a transmittance of the second color light emitted from the second light emitting layer is greater than or equal to 60% and an average visible light transmittance is 30% to 55%, and a third polarization region in which a transmittance of the third color light emitted from the third light emitting layer is greater than or equal to 60% and an average visible light transmittance is 30% to 55%.

[2] The organic electroluminescence display device according to [1], in which the polarizer has all of the first polarization region, the second polarization region, and the third polarization region.

[3] The organic electroluminescence display device according to [1] or [2], in which a black matrix is provided at a boundary of each region of the first polarization region, the second polarization region, and the third polarization region.

[4] The organic electroluminescence display device according to any one of [1] to [3], in which maximum wavelengths of spectra of the lights of the first color, the second color, and the third color are separated from each other by 50 nm or more.

[5] The organic electroluminescence display device according to any one of [1] to [4], in which the maximum wavelengths of the spectra of the lights of the first color, the second color, and the third color are respectively 430 to 480 nm, 500 to 550 nm, and 600 to 650 nm.

[6] The organic electroluminescence display device according to any one of [1] to [5], in which the polarizer is an absorption type linear polarizer, and the optically anisotropic layer satisfies Expression (1)

$$120 \leq Re(550) \leq 160 \text{ nm} \qquad (1)$$

here, in Expression (1), Re (550) represents in-plane retardation of the optically anisotropic layer at a wavelength of 550 nm.

According to the present invention, it is possible to provide an organic EL display device having high luminance while maintaining an excellent effect of suppressing external light reflection.

BRIEF DESCRIPTION OF THE DRAWINGS

FIG. 1 is a schematic cross-sectional view showing an example of an embodiment of an organic EL display device of the present invention.

DESCRIPTION OF THE PREFERRED EMBODIMENTS

Hereinafter, the present invention will be described in detail.

In some cases, the explanation of the constitutional requirements which will be described below is based on the representative embodiment of the present invention, but the present invention is not limited to such an embodiment.

In the present specification, the numerical range represented by "to" means a range including numerical values denoted before and after "to" as a lower limit value and an upper limit value.

In addition, "orthogonal" and "parallel" with respect to angles means a range of an exact angle ±10°, and "identical" and "different" with respect to angles can be determined based on whether or not the difference between angles is less than 5°.

In addition, in the present specification, "visible light" refers to light of a wavelength of 400 to 700 nm. In addition, in the present specification, a measurement wavelength is 550 nm unless otherwise specified.

Next, terms used in the present specification will be described.

<Slow Axis>

In the present specification, the "slow axis" means a direction in which a refractive index becomes maximum in the plane. A slow axis of an optically anisotropic layer is intended to mean a slow axis of the entirety of the optically anisotropic layer.

<Re(λ),Rth(λ)>

In the present specification, "Re (λ)" and "Rth (λ)" respectively represent in-plane retardation at a wavelength λ and retardation in a thickness direction.

Re (λ) is measured by making light of a wavelength λ nm incident in a film normal direction using KOBRA 21ADH or KOBRA WR (all are manufactured by Oji Scientific Instruments). In a case of selecting a measurement wavelength λ nm, it is possible to perform measurement by manually exchanging a wavelength selective filter or converting the measurement value using a program or the like.

Here, in a case where a film to be measured is represented by a uniaxial or biaxial index ellipsoid, Rth (λ) is calculated through the following method.

Rth (λ) is calculated by KOBRA 21ADH or KOBRA WR based on an input film thickness value, an assumed value of an average refractive index, and a retardation value obtained by measuring 6 points of Re (λ) in total by making light of a wavelength 2 nm be incident in directions inclined in 10 degree steps up to 50 degrees on a single side from the normal direction with respect to the film normal direction having an in-plane slow axis (determined using KOBRA 21ADH or WR) as an inclination axis (rotation axis) (in a case where there is no slow axis, an arbitrary direction in a film plane is set as a rotation axis).

In the above description, in a case of a film having a direction in which the retardation value becomes zero at a certain inclination angle and having an in-plane slow axis from a normal direction as a rotation axis, a sign of the retardation value at a larger inclination angle than the certain inclination angle is changed to a minus sign, and then, calculation is performed using KOBRA 21ADH or KOBRA WR.

Rth can be calculated using Equation (1) and Equation (2) based on an input film thickness value, an assumed value of an average refractive index, and a value obtained by measuring the retardation value from two arbitrary inclination directions while having a slow axis as an inclination axis (rotation axis) (in a case where there is no slow axis, an arbitrary direction in a film plane is set as a rotation axis).

$$Re(\theta) = \left[ nx - \frac{ny \times nz}{\sqrt{\left\{ny \sin\left(\sin^{-1}\left(\frac{\sin(-\theta)}{nx}\right)\right)\right\}^2 + \left\{nz \cos\left(\sin^{-1}\left(\frac{\sin(-\theta)}{nx}\right)\right)\right\}^2}} \right] \times \frac{d}{\cos\left\{\sin^{-1}\left(\frac{\sin(-\theta)}{nx}\right)\right\}}$$

Equation (1)

$$Rth = \left(\frac{nx + ny}{2} - nz\right) \times d$$

Equation (2)

In the equation, Re (θ) represents a retardation value in a direction inclined by an angle θ from a normal direction. In addition, nx represents a refractive index in a slow axis direction in the plane, ny represents a refractive index in a direction orthogonal to nx in the plane, and nz represents a refractive index in directions orthogonal to nx and ny. d represents the thickness of a film.

In a case where a film to be measured is a film which cannot be expressed by a uniaxial or biaxial index ellipsoid, that is, a film in which there is no so-called optic axis, Rth (?) is calculated through the following method.

Rth (λ) is calculated by KOBRA 21ADH or WR based on an input film thickness value, an assumed value of an average refractive index, and a retardation value obtained by measuring 11 points of Re (λ) by making light of a wavelength λ nm be incident in directions inclined in 10 degree steps from −50 degrees to +50 degrees with respect to a film normal direction having an in-plane slow axis (determined using KOBRA 21ADH or KOBRA WR) as an inclination axis (rotation axis).

In the above-described measurement, it is possible to use values of catalogs of various optical films in Polymer Handbook (JOHN WILEY & SONS, INC) as the assumed value of the average refractive index. It is possible to measure the average refractive index value using Abbe's refractometer in a case where the average refractive index value is not known. Main average refractive index values of the optical films are exemplified below: cellulose acylate (1.48); cycloolefin polymer (1.52); polycarbonate (1.59); polymethyl methacrylate (1.49); and polystyrene (1.59). In a case where the film thickness and the assumed values of the average refractive indexes are input, nx, ny, and nz are calculated in KOBRA 21ADH or KOBRAWR. Nz=(nx−nz)/(nx−ny) is further calculated using the calculated nx, ny, and nz.

[Organic EL Display Device]

The organic EL display device of the present invention is an organic electroluminescence display device including a polarizer, an optically anisotropic layer, and a light emitting layer in this order.

In addition, in the organic EL display device of the present invention, the light emitting layer includes at least a plurality of first light emitting layers that emit a first color light, a plurality of second light emitting layers that emit a second color light, and a plurality of third light emitting layers that emit a third color light, on the same plane.

In addition, in the organic EL display device of the present invention, the polarizer has at least two regions selected from the group consisting of a first polarization region in which a transmittance of the first color light emitted from the first light emitting layer is greater than or equal to 60% and an average visible light transmittance is 30% to 55%, a second polarization region in which a transmittance of the second color light emitted from the second light emitting layer is greater than or equal to 60% and an average visible light transmittance is 30% to 55%, and a third polarization region in which a transmittance of the third color light emitted from the third light emitting layer is greater than or equal to 60% and an average visible light transmittance is 30% to 55%.

In a case where the present invention has such a configuration, it is possible to exhibit high luminance while maintaining an excellent effect of suppressing external light reflection.

Although this is not clear in detail, the present inventors estimate as follows.

First, in the organic EL display devices in the related art described in JP1997-127885A (JP-H09-127885A) and WO2013/137464A, as described above, the transmittance of the light emitted from the light emitting layer becomes 40% to 50% due to the presence of a linear polarizer included in a circular polarization plate provided for suppressing external light reflection, and therefore, the luminance of the organic EL display device is lowered.

On the other hand, the present invention has a polarizer (hereinafter also referred to as a "pattern polarizer"), as a polarizer, including two or more predetermined regions of which the transmittance is changed so as to correspond to an emission fraction of the light emitting layer. Therefore, the polarizer transmits 50% or more of light (for example, red light) emitted from the light emitting layer in each region and works as a linear polarizer with respect to other light beams (for example, blue light and green light). Thus, it is considered that the luminance of the organic EL display device is improved. Among the external light beams, light having the same color as light emitted from the light emitting layer is transmitted through the polarizer together with light emitted from the light emitting layer, but reflection of other light can be suppressed. Therefore, it is possible to maintain an excellent effect of suppressing external light reflection.

Next, after describing the entire configuration of the organic EL display device of the present invention with reference to FIG. 1, the configuration of each part will be described in detail.

FIG. 1 is a schematic cross-sectional view showing an example of an embodiment of an organic EL display device of the present invention.

The organic EL display device 10 shown in FIG. 1 has a pattern polarizer 7, an optically anisotropic layer 6, and a light emitting layer 3 in this order from the visible side.

In addition, as shown in FIG. 1, the light emitting layer 3 includes at least a plurality of first light emitting layers 3R that emit a first color light, a plurality of second light emitting layers 3B that emit a second color light, and a plurality of third light emitting layers 3G that emit a third color light, on the same plane.

In addition, as shown in FIG. 1, the pattern polarizer 7 has at least two regions selected from the group consisting of a first polarization region 7BG in which a transmittance of the first color light emitted from the first light emitting layer 3R of the light emitting layer 3 is greater than or equal to 60% and an average visible light transmittance is 30% to 55%, a second polarization region 7RG in which a transmittance of the second color light emitted from the second light emitting layer 3B of the light emitting layer 3 is greater than or equal to 60% and an average visible light transmittance is 30% to 55%, and a third polarization region 7RB in which a transmittance of the third color light emitted from the third light emitting layer G of the light emitting layer 3 is greater than or equal to 60% and an average visible light transmittance is 30% to 55%. In the organic EL display device 10 shown in FIG. 1, a suitable embodiment in which the pattern polarizer 7 has all three regions selected from the above-described group is shown.

In the organic EL display device 10 shown in FIG. 1, each region (for example, the first polarization region 7BG) in the pattern polarizer 7 is disposed so as to receive only light from each light emitting layer (for example, the first light emitting layer 3R) in the corresponding light emitting layer 3 and such that each region and each light emitting layer overlap with each other in a light emitting direction. As shown in FIG. 1, the pattern polarizer 7 and the light emitting layer 3 preferably have a black matrix 8 for partitioning each region (each layer).

On the other hand, an embodiment having a transparent substrate 5, a transparent electrode (cathode) 4, a metal electrode (anode) 2, and a thin film transistor (TFT) substrate 1 from the visible side is shown in the organic EL display device 10 shown in FIG. 1 in addition to the above-described configuration similarly to the well-known organic EL display devices in the related art. However, the configuration (for example, a layer configuration) of the transparent substrate 5, the transparent electrode 4, the metal electrode 2, and the TFT substrate 1 in the organic EL display device of the present invention is not particularly limited.

[Pattern Polarizer]

As described above, the pattern polarizer included in the organic EL display device of the present invention has at least two regions selected from the group consisting of a first polarization region in which a transmittance of the first color light emitted from the first light emitting layer is greater than or equal to 60% and an average visible light transmittance is 30% to 55%, a second polarization region in which a transmittance of the second color light emitted from the second light emitting layer is greater than or equal to 60% and an average visible light transmittance is 30% to 55%, and a third polarization region in which a transmittance of the third color light emitted from the third light emitting layer is greater than or equal to 60% and an average visible light transmittance is 30% to 55%.

Here, in the present specification, the transmittance of light of each color (first color to third color) is obtained by defining a ratio of an integral value II to an integral value I as a transmittance by measuring an emission spectrum of light of each color emitted from each light emitting layer (for example, the first light emitting layer) and a transmitted light spectrum of light transmitted through each polarization region in a case where each light emitting layer (for example, the first light emitting layer) and each polarization region (for example, the first polarization region) are made to overlap each other, under the same condition, and then, setting a value obtained by integrating the emission spectrum between wavelengths of 400 nm to 700 nm as an integral value I and a value obtained by integrating the transmitted light spectrum between wavelengths of 400 nm to 700 nm as an integral value II.

In addition, the average visible light transmittance is a value obtained by measuring the light transmittance every 1 nm in a visible light region at a wavelength of 400 to 700 nm and taking an arithmetic mean.

The transmittance of light of each color emitted from each light emitting layer in each polarization region (the first polarization region to the third polarization region) of the above-described pattern polarizer is greater than or equal to 60%, preferably greater than or equal to 80%, more preferably greater than or equal to 70%, and still more preferably 65%.

In each polarization region of the pattern polarizer, the average visible light transmittance in all regions is 30% to 55%, preferably 40% to 55%, more preferably 45% to 55%, and still more preferably 50% to 55%.

In the present invention, it is preferable that the pattern polarizer has all of a first polarization region, a second polarization region, and a third polarization region, because an organic EL display device having higher luminance can be obtained.

In addition, for the same reason, the above-described pattern polarizer is preferably an absorption type linear polarizer.

The constituent material of each polarization region (the first polarization region to the third polarization region) of the above-described pattern polarizer is not particularly limited as long as the transmittance of light of each color emitted from each light emitting layer and the average visible light transmittance satisfy the above-described value. For example, in a case where the first color emitted from the first light emitting layer is red, it is preferable to use a dichroic coloring agent containing a blue coloring agent and a green coloring agent from the viewpoint of allowing the first polarization region provided corresponding to the first light emitting layer to transmit 60% or more of red light and to function as a linear polarizer with respect to blue light and green light contained in reflected light derived from external light, that is, from the viewpoint of absorbing blue light and green light.

Similarly, in a case where the second color emitted from the second light emitting layer is blue, it is preferable to use a dichroic coloring agent containing a red coloring agent and a green coloring agent in the second polarization region provided corresponding to the second light emitting layer. In a case where the third color emitted from the third light emitting layer is green, it is preferable to use a dichroic coloring agent containing a red coloring agent and a blue coloring agent in the third polarization region provided corresponding to the third light emitting layer.

As such Examples of such a dichroic coloring agent, any material can be appropriately selected from well-known materials based on merocyanine, styryl, azomethine, anthraquinone, azo, quinone, quinophthalone, perylene, indigo, and tetrazine. Specific examples thereof include compounds disclosed in paragraphs [0012] to [0025] of JP1997-73015A (JP-H09-73015A).

In addition, the dichroic coloring agent may be a polymer having an alignment group in a side chain.

In the present invention, it is preferable that a black matrix (black partition wall) is provided at a boundary of each region of the first polarization region, the second polarization region, and the third polarization region in the above-described pattern polarizer.

Examples of a method for forming such a black matrix include a method using a photosensitive resin composition containing a light-shielding coloring agent (for example, carbon black). Specific examples thereof include a method in which the top of a support before forming a polarization region is coated with a photosensitive resin composition, pattern exposure is performed, and a portion where a polarization region is formed is removed through development.

In addition, examples of such a black photosensitive resin composition include compositions disclosed in paragraphs [0037] to [0060] of JP2015-138180A, compositions disclosed in paragraphs [0026] to [0044] of JP2015-102792A.

In the present invention, the method for manufacturing the above-described pattern polarizer is not particularly limited, but examples thereof include a method in which an alignment film is formed on a support, alignment treatment (for example, rubbing treatment, and photo alignment treatment) is performed on the alignment film, and then, a coating solution containing the above-described dichroic coloring agent was applied on the alignment film and is cured.

Examples of the above-described support include a glass substrate and a polymer film. Examples of the material of the polymer film include a cellulose polymer; an acrylic polymer having acrylic acid ester polymers such as polymethyl methacrylate and a lactone ring-containing polymer; a thermoplastic norbornene polymer; a polycarbonate polymer; polyester polymers such as polyethylene terephthalate and polyethylene naphthalate; styrene polymers such as polystyrene and acrylonitrile-styrene copolymer (AS resin); polyolefin polymers such as polyethylene, polypropylene, and an ethylene-propylene copolymer; a vinyl chloride polymer; amide polymers such as nylon and aromatic polyamide; imide polymers; sulfone polymers; polyether sulfone polymers; polyether ether ketone polymers; polyphenylene sulfide polymers; vinylidene chloride polymers; vinyl alcohol polymers; vinyl butyral polymers; arylate polymers; polyoxymethylene polymers; epoxy polymers; or a polymer in which these polymers are mixed with each other.

The pattern polarizer of the present invention may be in an embodiment also serving as such a support.

In addition, the material forming the above-described alignment film is preferably a polymer material, and specific examples thereof preferably include polyvinyl alcohol or polyimide and derivatives thereof. Modified or unmodified polyvinyl alcohol is particularly preferable.

Examples of the alignment film that can be used in the present invention include alignment films disclosed in page 43, line 24 to page 49, line 8 of WO01/88574A; modified polyvinyl alcohols disclosed in paragraphs [0071] to [0095] of JP3907735B; and liquid crystal alignment films formed using a liquid crystal alignment agent disclosed in JP2012-155308A.

In addition, a photo-alignment film is exemplified as another alignment film that can be used, and examples thereof include polymer materials such as polyamide compounds and polyimide compounds disclosed in paragraphs [0024] to [0043] of WO2005/096041A; liquid crystal alignment films formed using a liquid crystal alignment agent having a photo-aligned group disclosed in JP2012-155308A; and LPP-JP265CP which is a trade name manufactured by Rolic Technologies.

The pattern polarizer of the present invention may be in an embodiment also serving as such an alignment film.

In the present invention, the thickness of the pattern polarizer is not particularly limited, but the thickness in the polarization region not including the support or the alignment film is preferably 300 to 2,000 nm and more preferably 400 to 1,000 nm.

[Optically Anisotropic Layer]

The optically anisotropic layer included in the organic EL display device of the present invention is not particularly limited, and a well-known optically anisotropic layer in the related art can be appropriately adopted and used.

In the present invention, the above-described optically anisotropic layer is preferably an optically anisotropic layer containing a liquid crystalline compound. The above-described optically anisotropic layer may have a single layer structure or a laminated structure.

<Liquid Crystalline Compound>

In general, liquid crystalline compounds can be classified into a rod-like type and a disc-like type depending on their shape. Furthermore, there is a low molecular type and a polymer type. The high molecule generally indicates a molecule having a degree of polymerization of greater than or equal to 100 (Polymer physics-Phase Transition Dynamics, Masao Doi, p. 2, Iwanami Shoten, 1992). In the present invention, any liquid crystalline compound can be used, but it is preferable to use a rod-like liquid crystal compound or a discotic liquid-crystalline compound (disc-like liquid crystal compound). Two or more rod-like liquid crystal compounds, two or more disc-like liquid crystal compounds, or a mixture of a rod-like liquid crystal compound and a disc-like liquid crystal compound may be used. In order to immobilize the above-described liquid crystalline compound, it is more preferable to form the liquid crystalline compound using a rod-like liquid crystal compound or a disc-like liquid crystal compound having a polymerizable group, and it is still more preferable that the liquid crystalline compound has two or more polymerizable groups in one molecule. In the case of a mixture of two or more kinds of liquid crystalline compounds, it is preferable that at least one kind of liquid crystalline compound has two or more polymerizable groups in one molecule.

It is possible to preferably use, for example, a rod-like liquid crystal compound disclosed in claim 1 of JP1999-513019A (JP-H11-513019A) or a rod-like liquid crystalline compound disclosed in paragraphs [0026] to [0098] in JP2005-289980A as the rod-like liquid crystal compound. It is possible to preferably use, for example, a disk-like liquid crystal compound disclosed in paragraphs [0020] to [0067] of JP2007-108732A or a discotic liquid-crystalline compound disclosed in paragraphs [0013] to [0108] of JP2010-244038A. However, the present invention is not limited thereto.

In the present invention, it is preferable that the optically anisotropic layer satisfies Formula (1) because the excellent effect of suppressing external light reflection can be further maintained.

$$120 \leq Re(550) \leq 160 \text{ nm} \quad (1)$$

Here, in Expression (1), Re (550) represents in-plane retardation of the optically anisotropic layer at a wavelength of 550 nm.

In the present invention, the optically anisotropic layer is preferably a laminate having a λ/2 plate and a λ/4 plate because the optically anisotropic layer can function as a λ/4 plate in a wide wavelength range and can be more suitably used as a circular polarization plate.

In the present specification, "circular polarization plate" means both a long circular polarization plate and a circular polarization plate cut into a size so as to be incorporated in a display device unless otherwise specified. In addition, the "cutting" referred to herein also includes "punching", "cutting out", and the like.

<λ/2 Plate>

The λ/2 plate is an optically anisotropic layer in which an in-plane retardation Re (λ) at a specific wavelength of λ nm satisfies Re (λ)=λ/2. This equation may be attained at any wavelength (for example, 550 nm) in a visible light region.

In the present invention, the in-plane retardation Re (550) of the λ/2 plate at a wavelength of 550 nm is preferably 205 to 275 nm and more preferably 215 to 265 nm.

Rth (550) which is a retardation value in a thickness direction of the λ/2 plate and is measured at a wavelength of 550 nm is preferably −240 to 240 nm and more preferably −160 to 160 nm from the viewpoint of further excellent effects of the present invention.

The thickness of the λ/2 plate is not particularly limited, but is preferably 0.5 to 10 μm and more preferably 0.5 to 5 μm, for the reason that thinning of the display device is easily achieved.

The above-described thickness is intended to be an average thickness, and is obtained by measuring 5 arbitrary points of the thicknesses of the λ/2 plate and arithmetically averaging the measured thicknesses.

It is more preferable to form the λ/2 plate using a liquid crystalline compound (a rod-like liquid crystal compound or a disk-like liquid crystal compound) having a polymerizable group since it is possible to reduce the temperature change or the humidity change of optical characteristics. A mixture of two or more liquid crystalline compounds may be used, and in this case, at least one liquid crystal compound preferably has two or more polymerizable groups.

That is, the λ/2 plate is preferably a layer formed by immobilizing a rod-like liquid crystal compound having a polymerizable group or a disk-like liquid crystal compound having a polymerizable group through polymerization. In this case, it is unnecessary for the λ/2 plate to exhibit liquid crystallinity anymore after the liquid crystal compound becomes a layer.

The types of the polymerizable groups contained in a rod-like liquid crystal compound or a disk-like liquid crystal compound are not particularly limited, and a functional group enabling an addition polymerization reaction is preferable, and a polymerizable, ethylenically unsaturated group or a cyclic polymerizable group is preferable. More specifically, preferred examples thereof include a (meth)acryloyl group, a vinyl group, a styryl group, and an allyl group, and a (meth)acryloyl group is more preferable. The (meth)acryloyl group is a notation meaning a methacryloyl group or an acryloyl group.

<λ/4 Plate>

The λ/4 plate is a plate having a function of converting linear polarization at a specific wavelength into circular polarization (or circular polarization into linear polarization), and refers to an optically anisotropic layer in which the in-plane retardation Re (λ) at a specific wavelength λ nm satisfies Re (λ)=λ/4. This equation may be attained at any wavelength (for example, 550 nm) in a visible light region.

In the present invention, the in-plane retardation Re (550) of the λ/4 plate at a wavelength of 550 nm is preferably 100 to 150 nm and more preferably 110 to 140 nm.

Rth (550) which is a retardation value in a thickness direction of the λ/4 plate and is measured at a wavelength of 550 nm is preferably −120 to 120 nm and more preferably −80 to 80 nm from the viewpoint of further excellent effects of the present invention.

The thickness of the λ/4 plate is not particularly limited, but is preferably 0.5 to 10 μm and more preferably 0.5 to 5 μm, for the reason that thinning of the display device is easily achieved.

The above-described thickness is intended to be an average thickness, and is obtained by measuring 5 arbitrary points of the thicknesses of the λ/4 plate and arithmetically averaging the measured thicknesses.

Among them, the λ/4 plate is preferably a layer formed by immobilizing a liquid crystalline compound (a rod-like liquid crystal compound or a disk-like liquid crystal compound) having a polymerizable group through polymerization or the like, and in this case, it is unnecessary for the λ/4 plate to exhibit liquid crystallinity anymore after the liquid crystal compound becomes a layer.

In the present invention, in a case where a laminate having the above-described λ/2 plate and λ/4 plate is used as optically anisotropic layers, it is preferable that a circular polarization plate has the above-described polarizer, λ/2 plate and λ/4 plate in this order because the laminate functions as the circular polarization plate in a wide wavelength range. In addition, the angle formed by an in-plane slow axis of the λ/4 plate and an in-plane slow axis of the λ/2 plate is preferably 60°.

The method for forming the above-described λ/2 plate and λ/4 plate is not particularly limited, and examples thereof include well-known methods.

For example, the λ/2 plate and the λ/4 plate can be manufactured by coating a predetermined substrate (including a temporary substrate or any one of the λ/2 plate and the λ/4 plate) with a composition for forming an optically anisotropic layer containing a liquid crystalline compound having a polymerizable group (hereinafter, also simply referred to as a "composition") to form a coated film, and subjecting the obtained coated film to a curing treatment (irradiation with ultraviolet light (light irradiation treatment) or heating treatment). An alignment film to be described below may be used as necessary.

The coating using the above-described composition can be performed through a well-known method (for example, a wire bar-coating method, an extrusion coating method, a direct gravure coating method, a reverse gravure coating method, or a die-coating method).

Components other than the above-described liquid crystalline compounds may be contained in the above-described composition.

For example, a polymerization initiator may be contained in the composition. The polymerization initiator to be used can be selected according to the type of polymerization reaction, and examples thereof include a thermal polymerization initiator and a photopolymerization initiator. Examples of the photopolymerization initiator include an α-carbonyl compound, acyloin ether, an α-hydrocarbon-substituted aromatic acyloin compound, a polynuclear quinone compound, and a combination of triarylimidazole dimer and p-aminophenyl ketone.

The amount of the polymerization initiator used is, with respect to the total solid content of the composition, preferably 0.01 to 20 mass % and more preferably 0.5 to 5 mass %.

In addition, the composition may contain a polymerizable monomer from the viewpoints of evenness of a coating film and the strength of the film.

Examples of the polymerizable monomer include a radically polymerizable or cationically polymerizable compound. A polyfunctional radically polymerizable monomer is preferable, and a liquid crystalline compound containing the above-described polymerizable group and a copolymerizable monomer are preferable. Examples thereof include monomers disclosed in paragraphs [0018] to [0020] in JP2002-296423A.

The amount of polymerizable monomer to be added is, with respect to the total mass of the liquid crystalline compound, preferably 1 to 50 mass %, and more preferably 2 to 30 mass %.

In addition, a surfactant may be contained in the composition from the viewpoints of evenness of a coating film and the strength of the film.

Examples of the surfactant include well-known compounds in the related art, and a fluorine compound is particularly preferable. Specific examples thereof include compounds disclosed in paragraphs [0028] to [0056] in JP2001-330725A and compounds disclosed in paragraphs [0069] to [0126] in JP2003-295212.

In addition, the composition may contain a solvent, and an organic solvent is preferably used.

As the organic solvent, for example, an alcoholic solvent and a ketone solvent are preferably used.

Specific examples thereof include acetone, methyl ethyl ketone, 2-pentanone, 3-pentanone, 2-hexane, 2-heptanone, 4-heptanone, methyl isopropyl ketone, ethyl isopropyl ketone, diisopropyl ketone, methyl isobutyl ketone, methyl-t-butyl ketone, diacetylacetone, acetylacetone, acetonylacetone, diacetone alcohol, mesityl oxide, chloroacetone, cyclopentanone, cyclohexanone, and acetophenone. Among them, methyl ethyl ketone and methyl isobutyl ketone are preferable. These solvents may be used singly or as a mixture at an arbitrary mixing ratio.

In addition, the composition may contain various alignment agents such as vertical alignment promoters such as a vertical alignment agent on a polarizer interface side and a vertical alignment agent on an air interface side, and horizontal alignment promoters such as a horizontal alignment agent on a polarizer interface side and a horizontal alignment agent on an air interface side.

Furthermore, the composition may contain an adhesion improver, a plasticizer, or a polymer in addition to the above-described components.

In the present invention, the thickness of the above-described optically anisotropic layer (in the case where the optically anisotropic layer has the above-described) λ/2 plate and λ/4 plate, the sum of these thicknesses) is not particularly limited, but is preferably 0.1 to 10 μm and more preferably 0.5 to 5 μm.

[Light Emitting Layer]

The light emitting layer included in the organic EL display device of the present invention includes at least a plurality of first light emitting layers that emit a first color light, a plurality of second light emitting layers that emit a second color light, and a plurality of third light emitting layers that emit a third color light, on the same plane.

Here, a light emitting layer similar to a so-called three-color light emitting type light emitting layer used in an organic EL display device can be used as the above-described light emitting layer.

In the present invention, it is preferable that the maximum wavelengths of spectra of lights of the first color, the second color and the third color are separated from each other by 50 nm or more and it is more preferable that the maximum wavelengths of the spectra of the lights of the first color, the second color and the third color are respectively 430 to 480 nm, 500 to 550 nm, and 600 to 650 nm, because it is possible to improve color reproducibility.

The configuration of the above-described light emitting layer is not particularly limited as long as it has at least an active layer (a light emitting layer in a narrow sense), and an embodiment is preferable in which a hole transporting layer, an active layer, and an electron transporting layer are laminated in this order from an anode side.

In addition, suitable examples include an embodiment in which a hole injecting layer is laminated between the hole transporting layer and the anode; an embodiment in which an electron transporting intermediate layer (hole blocking layer) is laminated between the active layer and the electron transporting layer; an embodiment in which a hole transporting intermediate layer (electron blocking layer) is laminated between the active layer and the hole transporting layer; and an embodiment in which an electron injecting layer is laminated between the cathode and the electron transporting layer.

Specific layer configurations of the above-described light emitting layer are as follows, but the present invention is not limited to these configurations.

(Anode side) hole transporting layer/active layer/electron transporting layer (cathode side)

(Cathode side) hole transporting layer/active layer/blocking layer/electron transporting layer (anode side)

(Cathode side) hole transporting layer/active layer/blocking layer/electron transporting layer/electron injecting layer (anode side)

(Cathode side) hole injecting layer/hole transporting layer/active layer/electron transporting layer/electron injecting layer (anode side)

(Cathode side) hole injecting layer/hole transporting layer/active layer/blocking layer/electron transporting layer (anode side)

(Cathode side) hole injecting layer/hole transporting layer/active layer/blocking layer/electron transporting layer/electron injecting layer (anode side)

(Cathode side) hole injecting layer/hole transporting layer/exciton blocking layer/active layer/electron transporting layer/electron injecting layer (anode side)

Examples of such constituent materials include constituent materials disclosed in paragraphs [0058] to [0083] of JP2014-199274A, and light emitting materials in organic materials (B) disclosed in paragraphs [0039] to [0177] of JP2013-165089A.

[Transparent Substrate]

As shown in FIG. 1, the organic EL display device of the present invention preferably has a transparent substrate.

The transparent substrate is preferably a substrate that does not scatter or attenuate light emitted from the light emitting layer. In the case of organic materials, the organic materials are preferably excellent in heat resistance, dimensional stability, solvent resistance, electrical insulating properties, and workability.

Examples of such a transparent substrate include a substrate disclosed in paragraphs to [0073] of JP2008-270736A.

[Metal Electrode (Anode)]

As shown in FIG. 1, the organic EL display device of the present invention preferably has a metal electrode (anode).

In general, the anode may have a function as an electrode for supplying holes to the light emitting layer. The shape, the structure, the size, and the like are not particularly limited and can be appropriately selected from well-known electrode materials.

Examples of the anode include an anode disclosed in paragraphs [0074] to [0081] of JP2008-270736A.

[Transparent Electrode (Cathode)]

As shown in FIG. 1, the organic EL display device of the present invention preferably has a transparent electrode (cathode).

In general, the cathode may have a function as an electrode for injecting electrons to an organic layer. The shape, the structure, the size, and the like are not particularly limited and can be appropriately selected from well-known electrode materials.

In addition, examples of the cathode include a cathode disclosed in paragraphs [0082] to [0089] of JP2008-270736A.

EXAMPLES

Hereinafter, the present invention will be more specifically described based on the following examples. The material, the usage, the proportion, treatment contents, a treatment procedure, and the like shown in examples below can be appropriately changed without departing from the gist of the present invention. Accordingly, the scope of the present invention should not be interpreted restrictively by the following examples.

Example 1

[Manufacture of Blue Light Emitting Element]

A glass substrate (ITO film thickness: 70 nm) having a thickness of 0.7 mm and having a 2.5 cm×2.5 cm indium tin oxide (ITO) film was placed in a washing container and was ultrasonically washed in 2-propanol. Thereafter, ultraviolet (UV)-ozone treatment was performed for 30 minutes.

Subsequently, the following organic compound layers were sequentially vapor-deposited on the ITO film of the glass substrate through a vacuum vapor deposition method using a vacuum vapor deposition device (Small-ELVESS manufactured by TOKKI).

First layer (hole injecting layer): HAT-CN (film thickness of 10 nm)

Second layer (hole transporting layer): NPD (film thickness of 30 nm)

Third layer (light emitting layer): ADN and DPAVBi (mass ratio of 97:3, film thickness of 30 nm)

Fourth layer (electron transporting layer): electron transporting material T (film thickness of 40 nm)

Subsequently, 1 nm lithium fluoride and 100 nm metallic aluminum were vapor-deposited on the above-described fourth layer in this order to obtain a cathode.

The laminate after the vapor deposition of the cathode was placed in a glove box in which the air was replaced with nitrogen gas without exposing the laminate to the atmospheric air, and the glove box was sealed with a glass sealing can and an ultraviolet curable adhesive (XNR 5516 HV, manufactured by Nagase-CHIBA, Ltd.) to manufacture a blue light emitting element (hereinafter, also referred to as a "light emitting element B").

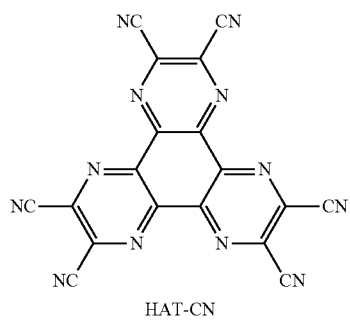
HAT-CN
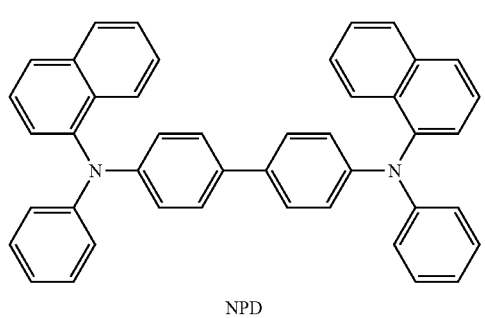
NPD
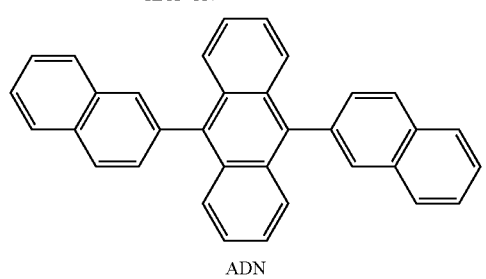
ADN
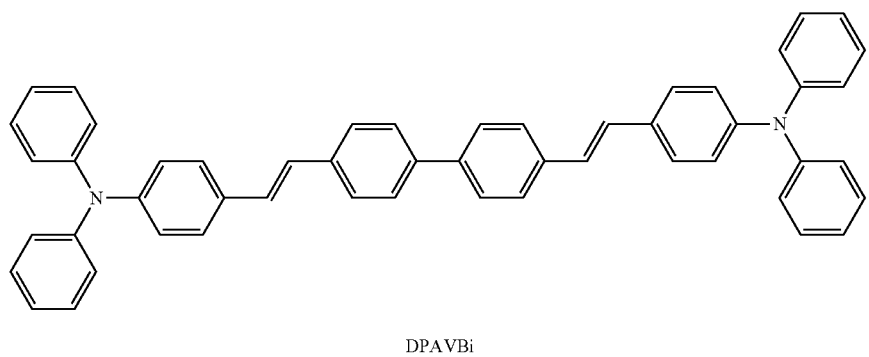
DPAVBi
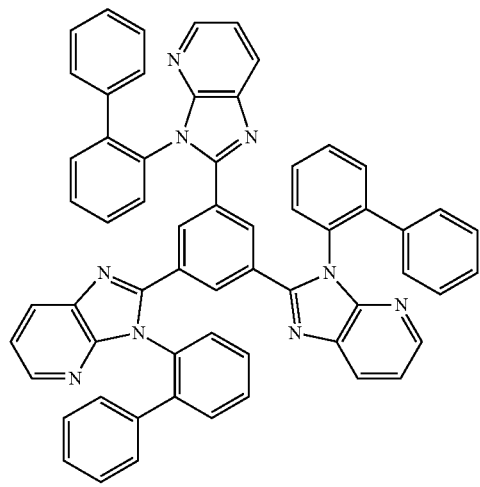
Electron transporting material T

[Manufacture of Green Light Emitting Element]

A green light emitting element (hereinafter also referred to as a "light emitting element G") was manufactured in the same manner as the light emitting element B except that the third layer (light emitting layer) in the manufacture of the above-described light emitting element B was changed as follows.

Third layer (light emitting layer): CBP and green light emitting material G (mass ratio of 97:6, film thickness of 30 nm)

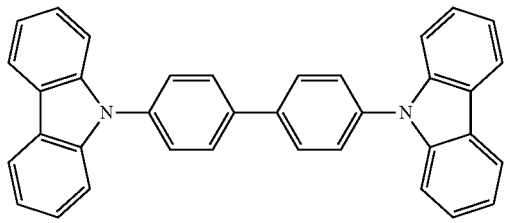

CBP

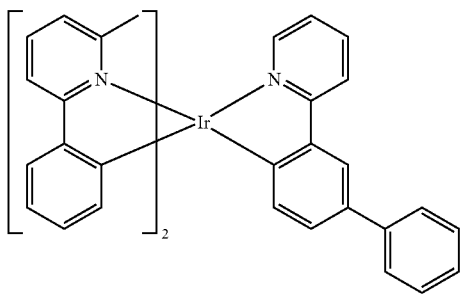

Green Light Emitting Material G

[Manufacture of Red Light Emitting Element]

A red light emitting element (hereinafter also referred to as a "light emitting element R") was manufactured in the same manner as the light emitting element B except that the third layer (light emitting layer) in the manufacture of the above-described light emitting element B was changed as follows.

Third layer (light emitting layer): BAlq and red light emitting material R (mass ratio of 97:6, film thickness of 30 nm)

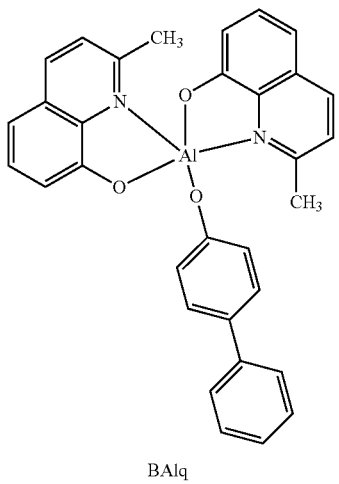

BAlq

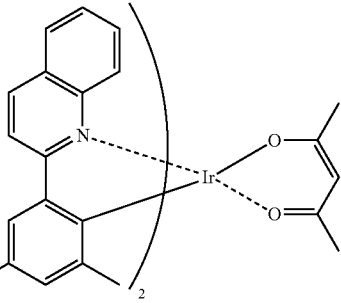

Red Light Emitting Material R

<Spectrum of Each Light Emitting Element>

Emission spectra of the manufactured light emitting elements B, G, and R were measured, and as a result, the wavelengths at which the emission spectra of the light emitting elements B, G and R become maximum were respectively 463 nm, 517 nm, and 622 nm.

Example 2

[Preparation of Coating Solution AL-1 for Forming Alignment Layer 1]

The following composition was prepared and filtered with a polypropylene filter having a pore size of 30 μm, which was used as a coating solution AL-1 for forming an alignment layer 1.

| Composition of coating solution AL-1 for forming alignment layer 1 | |
|---|---|
| Following modified polyvinyl alcohol | 2.4 parts by mass |
| Isopropyl alcohol | 1.6 parts by mass |
| Methanol | 36 parts by mass |
| Water | 60 parts by mass |

Modified polyvinyl alcohol

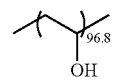

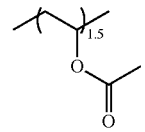

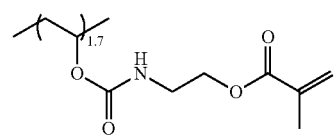

[Polarizer: Preparation of Coating Solution for Forming Polarization Region RG]

A coating solution RG for forming a polarization region RG of a polarizer corresponding to the above-described light emitting element B (blue light emitting element) was prepared.

| Composition of coating solution for forming polarization region RG | |
| --- | --- |
| Following dichroic coloring agent P | 52.60 parts by mass |
| Following dichroic coloring agent C | 9.95 parts by mass |
| Following fluorine-containing compound F | 0.32 parts by mass |
| Irgacure 819 (manufactured by BASF SE) | 3.00 parts by mass |
| Chloroform | 1461.60 parts by mass |
| Cyclopentanone | 162.40 parts by mass |

Dichroic Coloring Agent P

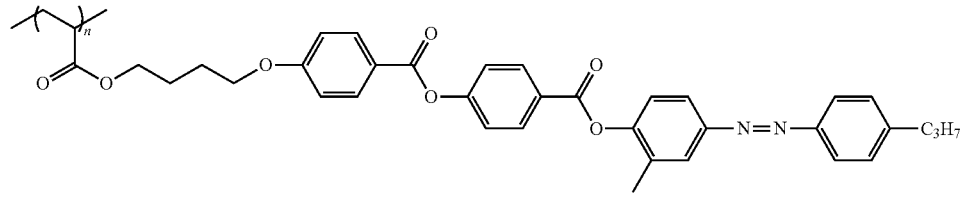

Dichroic Coloring Agent C

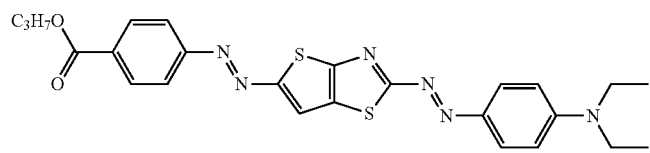

Fluorine-containing compound F

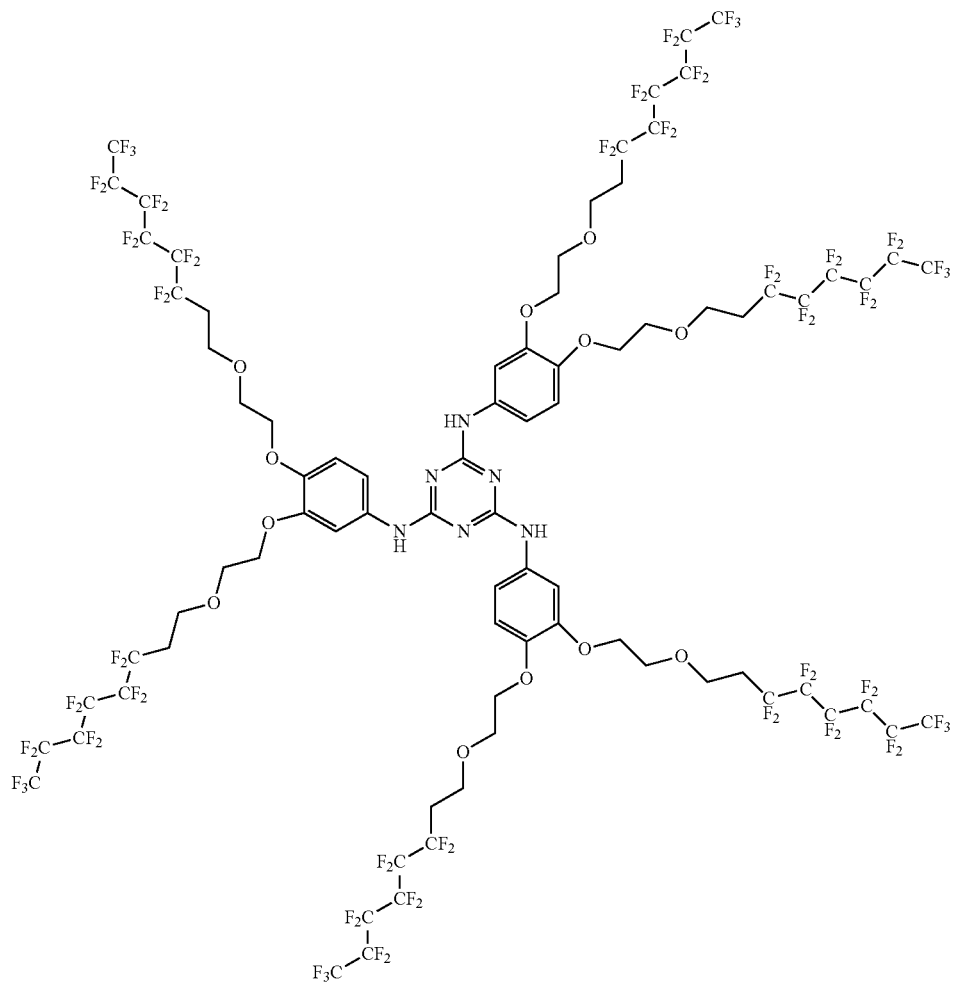 [SMILES: FC(F)(F)C(F)(F)C(F)(F)C(F)(F)C(F)(F)C(F)(F)CCOCCOc1ccc(Nc2nc(Nc3ccc(OCCOCCC(F)(F)C(F)(F)C(F)(F)C(F)(F)C(F)(F)C(F)(F)F)c(OCCOCCC(F)(F)C(F)(F)C(F)(F)C(F)(F)C(F)(F)C(F)(F)F)c3)nc(Nc3ccc(OCCOCCC(F)(F)C(F)(F)C(F)(F)C(F)(F)C(F)(F)C(F)(F)F)c(OCCOCCC(F)(F)C(F)(F)C(F)(F)C(F)(F)C(F)(F)C(F)(F)F)c3)n2)cc1OCCOCCC(F)(F)C(F)(F)C(F)(F)C(F)(F)C(F)(F)C(F)(F)F]

[Polarizer: Preparation of Coating Solution for Forming Polarization Region RB]

A coating solution RB for forming a polarization region RB of a polarizer corresponding to the above-described light emitting element G (green light emitting element) was prepared.

| Composition of coating solution RB for forming polarization region RB | |
|---|---|
| Above-described dichroic coloring agent P | 52.60 parts by mass |
| Following dichroic coloring agent Y | 7.11 parts by mass |
| Above-described dichroic coloring agent C | 5.69 parts by mass |
| Above-described fluorine-containing compound F | 0.32 parts by mass |
| Irgacure 819 (manufactured by BASF SE) | 3.00 parts by mass |
| Chloroform | 1461.60 parts by mass |
| Cyclopentanone | 162.40 parts by mass |

Dichroic Coloring Agent Y

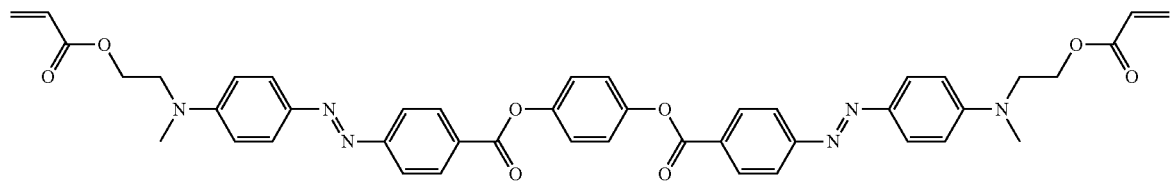 [SMILES: C=CC(=O)OCCN(C)c1ccc(/N=N/c2ccc(C(=O)Oc3ccc(OC(=O)c4ccc(/N=N/c5ccc(N(C)CCOC(=O)C=C)cc5)cc4)cc3)cc2)cc1]

[Polarizer: Preparation of Coating Solution for Forming Polarization Region BG]

A coating solution BG for forming a polarization region BG of a polarizer corresponding to the above-described light emitting element R (red light emitting element) was prepared.

| Composition of coating solution BG for forming polarization region BG | |
|---|---|
| Above-described dichroic coloring agent P | 52.60 parts by mass |
| Above-described dichroic coloring agent Y | 28.4 parts by mass |
| Following dichroic coloring agent M | 5.69 parts by mass |
| Above-described fluorine-containing compound F | 0.32 parts by mass |
| Irgacure 819 (manufactured by BASF SE) | 3.00 parts by mass |
| Chloroform | 1461.60 parts by mass |
| Cyclopentanone | 162.40 parts by mass |

Dichroic Coloring Agent M

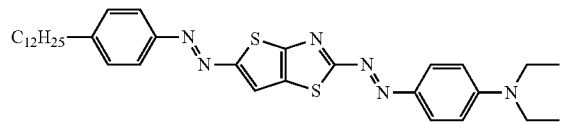

[Manufacture of Pattern Polarizer 1]

<Formation of Alignment Layer 1a>

The top of a commercially available glass substrate was coated with the prepared coating solution AL-1 for forming an alignment layer 1, and dried to form an alignment layer 1a.

Subsequently, rubbing treatment was applied to the formed alignment layer 1a.

<Formation of Polarization Region RG>

The above-described coating solution RG for forming a polarization region RG was cast on the alignment layer 1a subjected to rubbing treatment at 2,000 rpm for 10 seconds using a spin coater.

Subsequently, the cast coating solution RG for forming a polarization region RG was matured at a film surface temperature of 170° C. for 30 seconds. Then, the film surface temperature was cooled to 80° C. and was subjected to UV irradiation at a film surface temperature of 80° C. in a nitrogen atmosphere with an oxygen concentration of less than or equal to 0.3% (illuminance of 1,200 mJ/cm$^2$) to form a polarization region RG The thickness of only the formed polarization region RG was measured with an interference thickness meter, and was 437 nm.

Regarding the formed polarization region RG, the average visible light transmittance in a visible light region at 400 to 700 nm was measured and was 52%.

In addition, regarding the formed polarization region RG, the transmittance of light emitted from the light emitting element B (blue light emitting element) in the polarization region RG was measured through the above-described measurement method and was 61%.

<Formation of Polarization Region RB>

The above-described coating solution RB for forming a polarization region RB was cast on the alignment layer 1a subjected to rubbing treatment at 2,000 rpm for 10 seconds using a spin coater.

Subsequently, the cast coating solution RB for forming a polarization region RB was matured at a film surface temperature of 170° C. for 30 seconds. Then, the film surface temperature was cooled to 80° C. and was subjected to UV irradiation at a film surface temperature of 80° C. in a nitrogen atmosphere with an oxygen concentration of less than or equal to 0.3% (illuminance of 1,200 mJ/cm$^2$) to form the polarization region RB. The thickness of only the formed polarization region RB was measured with an interference thickness meter, and was 459 nm.

Regarding the formed polarization region RB, the average visible light transmittance in a visible light region at 400 to 700 nm was measured and was 54%.

In addition, regarding the formed polarization region RB, the transmittance of light emitted from the light emitting element G (green light emitting element) in the polarization region RB was measured through the above-described measurement method and was 61%.

<Formation of Polarization Region BG>

The above-described coating solution BG for forming a polarization region BG was cast on the alignment layer 1a subjected to rubbing treatment at 2,000 rpm for 10 seconds using a spin coater.

Subsequently, the cast coating solution BG for forming a polarization region BG was matured at a film surface temperature of 170° C. for 30 seconds. Then, the cast coating solution BG for forming a polarization region BG was cooled to a film surface temperature of 80° C. and was subjected to UV irradiation at a film surface temperature of 80° C. in a nitrogen atmosphere with an oxygen concentration of less than or equal to 0.3% (illuminance of 1,200 mJ/cm$^2$) to form a polarization region BG The thickness of only the formed polarization region BG was measured with an interference thickness meter, and was 606 nm.

Regarding the formed polarization region BG, the average visible light transmittance in a visible light region at 400 to 700 nm was measured and was 49%.

In addition, regarding the formed polarization region BG, the transmittance of light emitted from the light emitting element R (red light emitting element) in the polarization region BG was measured through the above-described measurement method and was 63%.

Example 3

[Preparation of Black Photosensitive Resin Composition for Preparing Partition Wall]

The amounts of K coloring agent dispersion 1 and propylene glycol monomethyl ether acetate shown in Table 1 were weighed, mixed at a temperature of 24° C. (±2° C.), and stirred at 150 rpm for 10 minutes.

Subsequently, the amounts of methyl ethyl ketone, a binder 2, hydroquinone monomethyl ether, a DPHA solution, 2,4-bis(trichloromethyl)-6-[4'-(N,N-diethoxycarbonyl-methylamino)-3'-bromophenyl]-s-triazin e, and a surfactant 1 shown in Table 1 were weighed and added in this order at a temperature of 25° C. (±2° C.), and stirred at 150 rpm at a temperature of 40° C. (±2° C.) for 30 minutes to prepare a black photosensitive resin composition.

The amounts shown in Table 1 are based on parts by mass, and the details of the composition are as follows.

<K Coloring Agent Dispersion 1>

Carbon black (Nipex 35 manufactured by Degussa AG): 13.1%

Dispersant (Compound 1): 0.65%

Polymer (random copolymer at molar ratio of benzyl methacrylate/methacrylic acid=72/28, molecular weight of 37,000): 6.72%

Propylene glycol monomethyl ether acetate: 79.53%

Compound 1

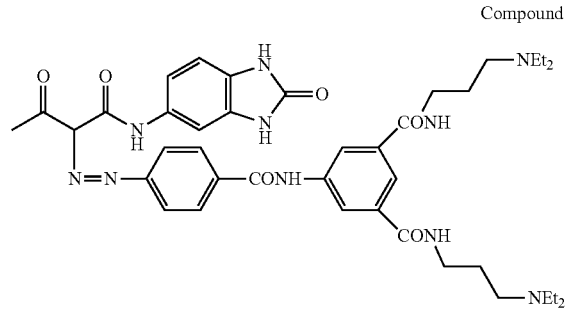

<Binder 2>

Polymer (random copolymer at molar ratio of benzyl methacrylate/methacrylic acid=78/22, molecular weight of 38,000): 27%

Propylene glycol monomethyl ether acetate: 73%

<DPHA Solution>

Dipentaerythritol hexaacrylate (containing 500 ppm of polymerization inhibitor MEHQ, manufactured by Nippon Kayaku Co., Ltd. trade name: KAYARAD DPHA): 76%

Propylene glycol monomethyl ether acetate: 24%

<Surfactant 1>

Structure 1: 30%

Methyl ethyl ketone: 70%

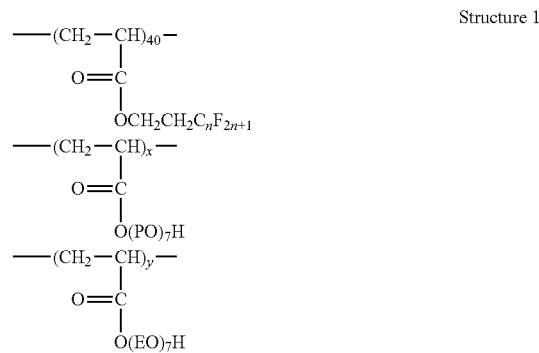

Structure 1

(n=6, x=55, y=5, Mw=33,940, Mw/Mn=2.55
PO: propylene oxide, EO: ethylene oxide)

TABLE 1

|  | (parts by mass) |
| --- | --- |
| Black photosensitive resin composition | K1 |
| K coloring agent dispersion 1 (Carbon black) | 5 |
| Propylene glycol monomethyl ether acetate | 8 |
| Methyl ethyl ketone | 53 |
| Binder 2 | 9.1 |
| Hydroquinone monomethyl ether | 0.002 |
| DPHA solution | 4.2 |
| 2,4-Bis(trichloromethyl)-6-[4'-(N,N-diethoxycarbonyl-methylamino)-3'-bromophenyl]-s-triazine | 0.16 |
| Surfactant 1 | 0.044 |

[Formation of Black Partition Wall (Black Matrix)]

The temperature of a commercially available polymethyl methacrylate film was adjusted to 23° C., and was then coated with a black photosensitive resin composition described in Table 1 using a coater for a glass substrate having a slit nozzle (manufactured by FAS CO., LTD., trade name: MH-1600).

Subsequently, a part of the solvent was removed for 30 seconds using a vacuum drying device (manufactured by VCD, TOKYO OHKA KOGYO CO., LTD.) to eliminate fluidity of the coated layer. Then, the coated layer was pre-baked at 120° C. for 3 minutes to obtain a black photosensitive layer K1.

Next, the distance between the surface of an exposure mask (a quartz exposure mask having an image pattern) and the black photosensitive layer K1 was set to be 200 µm in a state in which a substrate and the mask were vertically erected with a proximity type exposure machine having an ultrahigh pressure mercury lamp (manufactured by Hitachi High-Tech Electronics Engineering Co., Ltd.), to perform pattern exposure on the black photosensitive layer in a nitrogen atmosphere at an exposure amount of 300 mJ/cm$^2$.

Next, pure water was sprayed with a shower nozzle to evenly moisten the surface of the black photosensitive layer K1, and then, shower development was performed at 23° C. for 80 seconds at a flat nozzle pressure of 0.04 MPa using a potassium hydroxide type developer (containing KOH and a nonionic surfactant, trade name: CDK-1, manufactured by FUJIFILM Electronic Materials Co., Ltd.) to obtain a patterned image.

Subsequently, ultrapure water was jetted at a pressure of 9.8 MPa with an ultra-high pressure washing nozzle to remove residues, and post exposure was performed at an exposure amount of 2,000 mJ/cm² in the atmospheric air to obtain a black matrix.

A fine region separated by this black partition wall was formed on the surface of the polymethyl methacrylate film.

[Formation of Alignment Layer 1b]

The prepared coating solution AL-1 for forming an alignment layer 1 was deposited in a concave portion of a detailed region surrounded by the black partition wall using a piezo-type head and dried to form an alignment layer 1b.

Subsequently, rubbing treatment was applied to the formed alignment layer 1b.

[Manufacture of Pattern Polarizer 1]

In the concave portion having the alignment layer 1b, the coating solution RG for forming a polarization region RG was deposited in a concave portion corresponding to the light emitting element B using the piezo-type head. Similarly, the coating solution RB for forming a polarization region RB was deposited in a concave portion corresponding to the light emitting element G, and the coating solution BG for forming a polarization region BG was deposited in a concave portion corresponding to the light emitting element R. The deposition of the coating solutions was adjusted so that the film thicknesses of the polarization region RG, polarization region RB, and polarization region BG formed in the concave portion were respectively 437 nm, 459 nm, and 606 nm.

Subsequently, the coating solutions were matured at a film surface temperature of 170° C. for 30 seconds. Then, the coating solutions were cooled to a film surface temperature of 80° C. and were subjected to UV irradiation at a film surface temperature of 80° C. in a nitrogen atmosphere with an oxygen concentration of less than or equal to 0.3% (illuminance of 1,200 mJ/cm²). A pattern polarizer 1 was manufactured by forming each polarization region.

Example 4

[Surface Treatment of Polarizer 1 (Formation of Alignment Layer 1c)]

An alignment layer 1c was formed on the surface of the pattern polarizer 1 manufactured in Example 3 using the coating solution AL-1 for forming an alignment layer 1.

Next, rubbing treatment was applied to the surface of the alignment layer 1c in a direction of 45° with respect to a rubbing direction applied to the surface of the alignment layer 1b in Example 3.

[Manufacture of Optically Anisotropic Layer 1]

A coating solution 1 for an optically anisotropic layer 1 (A-plate) having the following composition was prepared.

| Composition of coating solution 1 for optically anisotropic layer 1 | |
|---|---|
| Following reciprocal wavelength dispersion liquid crystalline compound R-3 | 100 parts by mass |
| Photopolymerization initiator (Irgacure 819 (manufactured by BASF SE)) | 3.0 parts by mass |
| Following fluorine-containing compound A | 0.8 parts by mass |
| Following crosslinkable polymer O-2 | 0.3 parts by mass |
| Chloroform | 588 parts by mass |

Reciprocal wavelength dispersion liquid crystalline compound R-3: specific example II-3-9

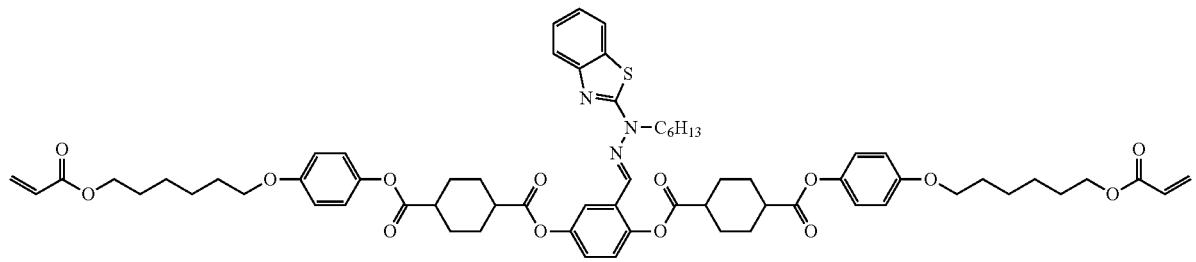

Fluorine-containing compound A

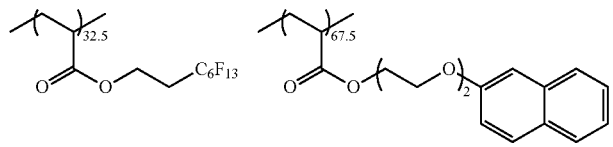

Crosslinkable polymer O-2

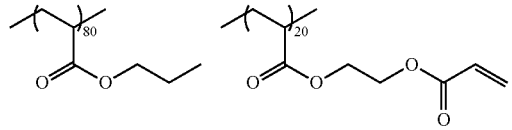

The surface of the alignment layer 1c subjected to rubbing treatment was coated with the coating solution 1 for an optically anisotropic layer using a bar coater.

Subsequently, the coating solution was heated and matured at a film surface temperature of 100° C. for 60 seconds and cooled to 70° C. Thereafter, the coating solution was irradiated with an ultraviolet ray of 1,000 mJ/cm² in air using a 70 mW/cm² air-cooled metal halide lamp (manufactured by EYE GRAPHICS Co., Ltd.), and the alignment state thereof was immobilized to form an optically anisotropic layer 1.

A laminate formed of a polymethyl methacrylate film, a polarizing layer 1, and an optically anisotropic layer 1 was formed through this procedure.

The laminate of the polymethyl methacrylate film, the polarizing layer 1, and the optically anisotropic layer 1 which has been manufactured in this manner is called a circular polarization plate 1.

In addition, Re and Rth of the optically anisotropic layer 1 were measured through the above-described measurement method. As a result, Re values at a wavelength of 450 nm, a wavelength of 550 nm, and a wavelength of 650 nm were respectively 108 nm, 130 nm, and 137 nm, and Rth at a wavelength of 550 nm was 65 nm.

Example 5

[Manufacture of Alignment Layer 2—Attached Temporary Support]

An alignment layer 2 was formed on the surface of a commercially available polyethylene terephthalate (PET) film using a coating solution for forming an alignment layer 2 having the following composition to manufacture an alignment layer 2—attached temporary support having PET as a temporary support.

| Composition of coating solution for forming alignment layer 2 | |
| --- | --- |
| Polyvinyl alcohol PVA 103 (manufactured by Kuraray Co., Ltd.) | 2.4 parts by mass |
| Isopropyl alcohol | 1.6 parts by mass |
| Methanol | 36 parts by mass |
| Water | 60 parts by mass |

[Manufacture of Optically Anisotropic Layer 2]

A coating solution 2 for an optically anisotropic layer 2 (C-plate) having the following composition was prepared.

| Composition of coating solution 2 for optically anisotropic layer 2 | |
| --- | --- |
| Following liquid crystalline compound B01 | 80 parts by mass |
| Following liquid crystalline compound B02 | 20 parts by mass |
| Following vertical alignment agent S01 | 1 part by mass |
| Following vertical alignment agent S02 | 0.5 parts by mass |
| Ethylene oxide-modified trimethylolpropane triacrylate (V#360 manufactured by OSAKA ORGANIC CHEMICAL INDUSTRY LTD.) | 8 parts by mass |
| Irgacure 907 (manufactured by BASF SE) | 3 parts by mass |
| KAYACURE DETX (manufactured by Nippon Kayaku Co., Ltd.) | 1 part by mass |
| Following polymer B03 | 0.4 parts by mass |
| Methyl ethyl ketone | 170 parts by mass |
| Cyclohexanone | 30 parts by mass |

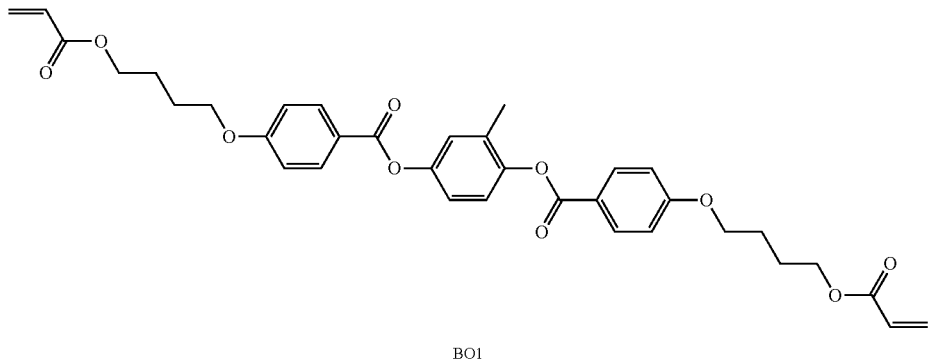 [SMILES: C=CC(=O)OCCCCOc1ccc(C(=O)Oc2ccc(OC(=O)c3ccc(OCCCCOC(=O)C=C)cc3)c(C)c2)cc1 ; "BO1"]

B01

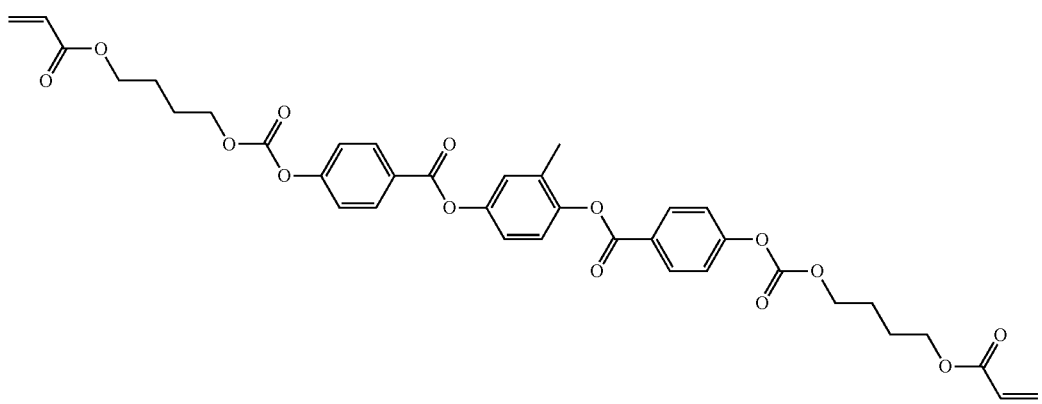

B02

Composition of coating solution 2 for optically anisotropic layer 2

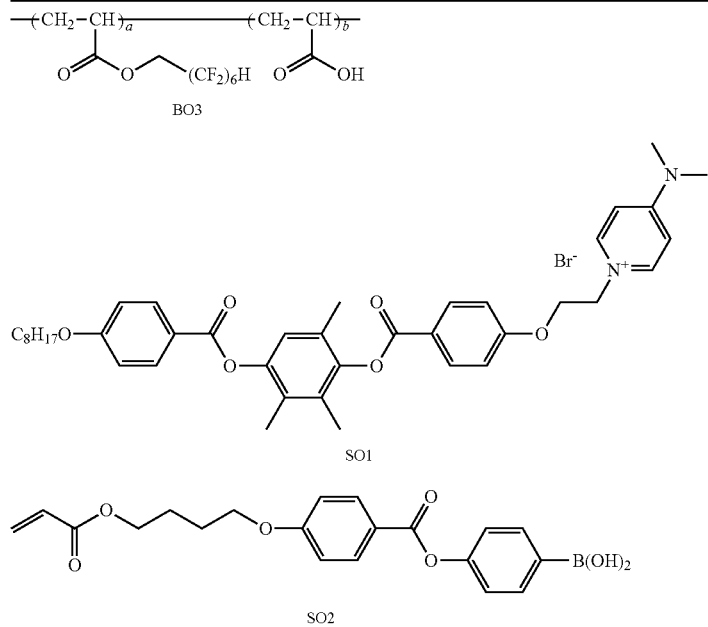

The surface of the alignment layer 2 of the alignment layer 2—attached temporary support was coated with the prepared coating solution 2 for an optically anisotropic layer 2 using a bar coater.

Subsequently, the coating solution was matured at a film surface temperature of 60° C. for 60 seconds. Thereafter, the coating solution was irradiated with an ultraviolet ray of 1,000 mJ/cm$^2$ in air using a 70 mW/cm$^2$ air-cooled metal halide lamp (manufactured by EYE GRAPHICS Co., Ltd.), and the alignment state thereof was immobilized to form an optically anisotropic layer 2.

In addition, Re and Rth of the optically anisotropic layer 2 were measured through the above-described measurement method. As a result, Re and Rth at a wavelength of 550 nm were respectively 0 nm and −60 nm.

[Manufacture of Circular Polarization Plate 2]

An optically anisotropic layer 2 (C-plate) side of the laminate of the optically anisotropic layer 2 and the alignment layer 2—attached temporary support was pasted to the optically anisotropic layer 1 (A-plate) side of the circular polarization plate 1 manufactured in Example 4 using a gluing agent (SK 2057, manufactured by Soken Chemical & Engineering Co., Ltd.).

The temporary support was peeled off after the pasting to manufacture a laminate of the circular polarization plate 1 and the optically anisotropic layer 2. The laminate of the circular polarization plate 1 and the optically anisotropic layer 2 manufactured in this manner is called a circular polarization plate 2.

Comparative Example 1

[Preparation of Coating Solution K for Forming Polarizer K]

A coating solution K for forming a polarizer K having the following composition was prepared.

| Composition of coating solution K for forming polarizer K | |
|---|---|
| Above-described dichroic coloring agent P | 52.60 parts by mass |
| Above-described dichroic coloring agent Y | 8.30 parts by mass |
| Above-described dichroic coloring agent M | 3.30 parts by mass |
| Above-described dichroic coloring agent C | 5.0 parts by mass |
| Fluorine-containing compound F | 0.32 parts by mass |
| Irgacure 819 (manufactured by BASF SE) | 3.00 parts by mass |
| Chloroform | 1461.60 parts by mass |
| Cyclopentanone | 162.40 parts by mass |

[Formation of Alignment Layer 1a]

The top of a commercially available glass substrate was coated with the prepared coating solution AL-1 for forming an alignment layer 1 and dried.

Subsequently, rubbing treatment was applied to the formed alignment layer 1a.

[Manufacture of Polarizer K]

The prepared coating solution K for forming a polarizer K was cast on the surface of the alignment layer 1a subjected to rubbing treatment at 2,000 rpm for 10 seconds using a spin coater.

The coating solution K for forming a polarizer K was matured at a film surface temperature of 170° C. for 30 seconds. Then, the film surface temperature was cooled to 80° C. and was subjected to UV irradiation at a film surface temperature of 80° C. in a nitrogen atmosphere with an oxygen concentration of less than or equal to 0.3% (illuminance of 1,200 mJ/cm$^2$) to form a polarizer K having a film thickness of 485 nm.

Regarding the manufactured polarizer K, the average visible light transmittance in a visible light region at 400 to 700 nm was measured and was 52%.

Comparative Example 2

[Formation of Alignment Layer 1d]

The top of a commercially available polymethyl methacrylate film was coated with the prepared coating solution AL-1 for forming an alignment layer 1 and dried.

Subsequently, rubbing treatment was applied to the formed alignment layer 1d.

[Manufacture of Polarizer K]

The coating solution K for forming a polarizer K prepared in Comparative Example 1 was cast on the surface of the alignment layer 1d subjected to rubbing treatment at 2,000 rpm for 10 seconds using a spin coater.

The coating solution K for forming a polarizer K was matured at a film surface temperature of 170° C. for 30 seconds. Then, the film surface temperature was cooled to 80° C. and was subjected to UV irradiation at a film surface temperature of 80° C. in a nitrogen atmosphere with an oxygen concentration of less than or equal to 0.3% (illuminance of 1,200 mJ/cm$^2$) to form a polarizer K having a film thickness of 485 nm.

Comparative Example 3

[Surface Treatment of Polarizer K (Formation of Alignment Layer 1e)]

An alignment layer 1e was formed on the surface of the polarizer K manufactured in Comparative Example 2 using the prepared coating solution AL-1 for forming an alignment layer 1.

Next, rubbing treatment was applied to the surface of the alignment layer 1e in a direction of 45° with respect to a rubbing direction applied to the surface of the alignment layer 1d in Comparative Example 2.

[Manufacture of Circular Polarization Plate 3]

An optically anisotropic layer 1 was manufactured in the same manner as in Example 4 except that the surface coated with the coating solution 1 for an optically anisotropic layer 1 (A-plate) was changed from the alignment layer 1c to the alignment layer 1e.

The laminate of the polymethyl methacrylate film, the polarizing layer K, and the optically anisotropic layer 1 which has been manufactured in this manner is called a circular polarization plate 3.

Comparative Example 4

[Manufacture of Circular Polarization Plate 4]

An optically anisotropic layer 2 (C-plate) side of the laminate of the optically anisotropic layer 2 manufactured in Example 5 and the alignment layer 2—attached temporary support was pasted to the optically anisotropic layer 1 (A-plate) side of the circular polarization plate 3 manufactured in Comparative Example 3 using a gluing agent (SK 2057, manufactured by Soken Chemical & Engineering Co., Ltd.). The temporary support was peeled off after the pasting to manufacture a laminate of the circular polarization plate 3 and the optically anisotropic layer 2. The laminate of the circular polarization plate 3 and the optically anisotropic layer 2 manufactured in this manner is called a circular polarization plate 4.

[Manufacture of Organic EL Light Emitting Display Device]

A TFT driving circuit made of low temperature polysilicon was formed on a glass substrate as a support, and a flattened film made of an acrylic resin was formed thereon.

Indium tin oxide (ITO) as a transparent conductive film was formed thereon to have a thickness of 120 nm through a sputtering method for patterning.

Next, an element isolation film was formed using an acrylic resin to manufacture an anode side transparent electrode substrate. After the anode side transparent electrode substrate was ultrasonically washed in 2-propanol, UV-ozone treatment was performed for 30 minutes.

An organic compound and a cathode material were formed on the transparent electrode film through vacuum vapor deposition.

The film formation of the organic EL light emitting element through vacuum vapor deposition of the organic compound and the cathode material was performed by making a blue (B) pixel have the same structure as the light emitting element B described in Example 1, making a green (G) pixel have the same structure as the light emitting element G described in Example 1, and making a red (R) pixel have the same structure as the light emitting element R in Example 1. The RGB pixels were respectively arranged in matrix shapes, and the panel size was set to be diagonally 3.75 inches and the number of pixels was set to be vertically 300 and horizontally 400.

In addition, a 700 nm thick silicon nitride oxide film was formed as a protective film, and a protective layer-attached organic EL display element was manufactured.

[Mounting of Circular Polarization Plate on Organic EL Light Emitting Element and Evaluation of Reflected Light]

Circular polarization plates 1 to 4 were pasted to the manufactured protective layer-attached organic EL display elements using a pressure sensitive gluing agent to manufacture organic EL display devices. At this time, regarding the circular polarization plates 1 and 2, the polarization regions RG, RB, and BG were respectively pasted so as to be laminated on the light emitting elements B, G, and R of light emitting layers to manufacture organic EL display devices.

The reflectance of the manufactured organic EL display devices at the time of displaying black was visually evaluated, and as a result, the reflectance was substantially the same as each other. On the other hand, the brightness at the time of displaying white was visually evaluated, and as a result, it became clear that the organic EL display devices equipped with the circular polarization plates 1 and 2 were brighter than the organic EL display devices equipped with the circular polarization plates 3 and 4.

EXPLANATION OF REFERENCES

1: TFT substrate
2: metal electrode (anode)
3: light emitting layer
3R: first light emitting layer
3B: second light emitting layer
3G: third light emitting layer
4: transparent electrode (cathode)
5: transparent substrate
6: optically anisotropic layer
7: pattern polarizer
7BG: first polarization region
7RG: second polarization region
7RB: third polarization region
8: black matrix
10: organic EL display device

What is claimed is:

1. An organic electroluminescence display device comprising:
   a polarizer;
   an optically anisotropic layer; and
   a light emitting layer in this order,
   wherein the light emitting layer includes at least a plurality of first light emitting layers that emit a first color light, a plurality of second light emitting layers that emit a second color light, and a plurality of third light emitting layers that emit a third color light, on the same plane, and wherein the polarizer has at least two regions selected from the group consisting of a first polarization region in which a transmittance of the first color light emitted from the first light emitting layer is greater than or equal to 60% and an average visible light transmittance is 30% to 55%, a second polarization region in which a transmittance of the second color light emitted from the second light emitting layer is greater than or equal to 60% and an average visible light transmittance is 30% to 55%, and a third polarization region in which a transmittance of the third color light emitted from the third light emitting layer is greater than or equal to 60% and an average visible light transmittance is 30% to 55%.

2. The organic electroluminescence display device according to claim 1, wherein the polarizer has all of the first polarization region, the second polarization region, and the third polarization region.

3. The organic electroluminescence display device according to claim 2, wherein a black matrix is provided at a boundary of each region of the first polarization region, the second polarization region, and the third polarization region.

4. The organic electroluminescence display device according to claim 2, wherein maximum wavelengths of spectra of the lights of the first color, the second color, and the third color are separated from each other by 50 nm or more.

5. The organic electroluminescence display device according to claim 2, wherein the maximum wavelengths of the spectra of the lights of the first color, the second color, and the third color are respectively 430 to 480 nm, 500 to 550 nm, and 600 to 650 nm.

6. The organic electroluminescence display device according to claim 2, wherein the polarizer is an absorption type linear polarizer, and the optically anisotropic layer satisfies Expression (1)

$$120 \leq Re(550) \leq 160 \text{ nm} \quad (1)$$

here, in Expression (1), Re (550) represents in-plane retardation of the optically anisotropic layer at a wavelength of 550 nm.

7. The organic electroluminescence display device according to claim 1, wherein a black matrix is provided at a boundary of each region of the first polarization region, the second polarization region, and the third polarization region.

8. The organic electroluminescence display device according to claim 7, wherein maximum wavelengths of spectra of the lights of the first color, the second color, and the third color are separated from each other by 50 nm or more.

9. The organic electroluminescence display device according to claim 7, wherein the maximum wavelengths of the spectra of the lights of the first color, the second color, and the third color are respectively 430 to 480 nm, 500 to 550 nm, and 600 to 650 nm.

10. The organic electroluminescence display device according to claim 7, wherein the polarizer is an absorption type linear polarizer, and the optically anisotropic layer satisfies Expression (1)

$$120 \leq Re(550) \leq 160 \text{ nm} \quad (1)$$

here, in Expression (1), Re (550) represents in-plane retardation of the optically anisotropic layer at a wavelength of 550 nm.

11. The organic electroluminescence display device according to claim 1, wherein maximum wavelengths of spectra of the lights of the first color, the second color, and the third color are separated from each other by 50 nm or more.

12. The organic electroluminescence display device according to claim 11, wherein the maximum wavelengths of the spectra of the lights of the first color, the second color, and the third color are respectively 430 to 480 nm, 500 to 550 nm, and 600 to 650 nm.

13. The organic electroluminescence display device according to claim 11, wherein the polarizer is an absorption type linear polarizer, and the optically anisotropic layer satisfies Expression (1)

$$120 \leq Re(550) \leq 160 \text{ nm} \quad (1)$$

here, in Expression (1), Re (550) represents in-plane retardation of the optically anisotropic layer at a wavelength of 550 nm.

14. The organic electroluminescence display device according to claim 1, wherein the maximum wavelengths of the spectra of the lights of the first color, the second color, and the third color are respectively 430 to 480 nm, 500 to 550 nm, and 600 to 650 nm.

15. The organic electroluminescence display device according to claim 14, wherein the polarizer is an absorption type linear polarizer, and the optically anisotropic layer satisfies Expression (1)

$$120 \leq Re(550) \leq 160 \text{ nm} \quad (1)$$

here, in Expression (1), Re (550) represents in-plane retardation of the optically anisotropic layer at a wavelength of 550 nm.

16. The organic electroluminescence display device according to claim 1, wherein the polarizer is an absorption type linear polarizer, and the optically anisotropic layer satisfies Expression (1)

$$120 \leq Re(550) \leq 160 \text{ nm} \quad (1)$$

here, in Expression (1), Re (550) represents in-plane retardation of the optically anisotropic layer at a wavelength of 550 nm.

* * * * *